US012593506B2

(12) United States Patent
Luo

(10) Patent No.: US 12,593,506 B2
(45) Date of Patent: Mar. 31, 2026

(54) ARRAY SUBSTRATE, PREPARATION METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Chuanbao Luo, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 1137 days.

(21) Appl. No.: 17/620,724

(22) PCT Filed: Oct. 29, 2021

(86) PCT No.: PCT/CN2021/127496
§ 371 (c)(1),
(2) Date: May 4, 2023

(87) PCT Pub. No.: WO2023/070540
PCT Pub. Date: Apr. 5, 2023

(65) Prior Publication Data
US 2024/0030242 A1 Jan. 25, 2024

(30) Foreign Application Priority Data
Oct. 25, 2021 (CN) .......................... 202111243065.5

(51) Int. Cl.
| | |
|---|---|
| *H10D 86/40* | (2025.01) |
| *G06F 3/041* | (2006.01) |
| *G06F 3/044* | (2006.01) |

(52) U.S. Cl.
CPC ......... *H10D 86/481* (2025.01); *G06F 3/0412* (2013.01); *G06F 3/0443* (2019.05);
(Continued)

(58) Field of Classification Search
CPC .... H10D 86/481; G06F 3/0443; G06F 3/0412
See application file for complete search history.

(56) References Cited

U.S. PATENT DOCUMENTS

| | | | |
|---|---|---|---|
| 2018/0150175 A1 | 5/2018 | Li et al. | |
| 2018/0181247 A1* | 6/2018 | Yang ..................... | G06F 3/0412 |
| 2019/0025971 A1 | 1/2019 | Li et al. | |

FOREIGN PATENT DOCUMENTS

| | | |
|---|---|---|
| CN | 104699344 A | 6/2015 |
| CN | 106654067 A | 5/2017 |

(Continued)

OTHER PUBLICATIONS

International Search Report in International application No. PCT/CN2021/127496, mailed on Jul. 25, 2022.
(Continued)

*Primary Examiner* — Peter M Albrecht
(74) *Attorney, Agent, or Firm* — PV IP PC; Christopher S. Ruprecht; Wei Te Chung

(57) ABSTRACT

The application discloses an array substrate, a preparation method thereof, and a display panel. The array substrate includes a substrate and a touch unit. The substrate includes a non-pixel region. The touch unit is disposed on the substrate, and the touch unit is located in the non-pixel area. The touch unit includes a touch transistor disposed on the substrate, a pressure-sensitive layer, and a first touch electrode. The touch transistor comprises a first gate. The pressure-sensitive layer and the first touch electrode are sequentially stacked on the first gate.

18 Claims, 5 Drawing Sheets

(52) U.S. Cl.
CPC .............. *G06F 2203/04103* (2013.01); *G06F 2203/04105* (2013.01)

(56) References Cited

FOREIGN PATENT DOCUMENTS

| CN | 107195665 A | 9/2017 |
| CN | 107275346 A | 10/2017 |
| CN | 107293553 A | 10/2017 |
| CN | 109933242 A | 6/2019 |
| CN | 112366210 A | 2/2021 |

OTHER PUBLICATIONS

Written Opinion of the International Search Authority in International application No. PCT/CN2021/127496, mailed on Jul. 25, 2022.
Chinese Office Action issued in corresponding Chinese Patent Application No. 202111243065.5 dated Nov. 2, 2022, pp. 1-5.

* cited by examiner

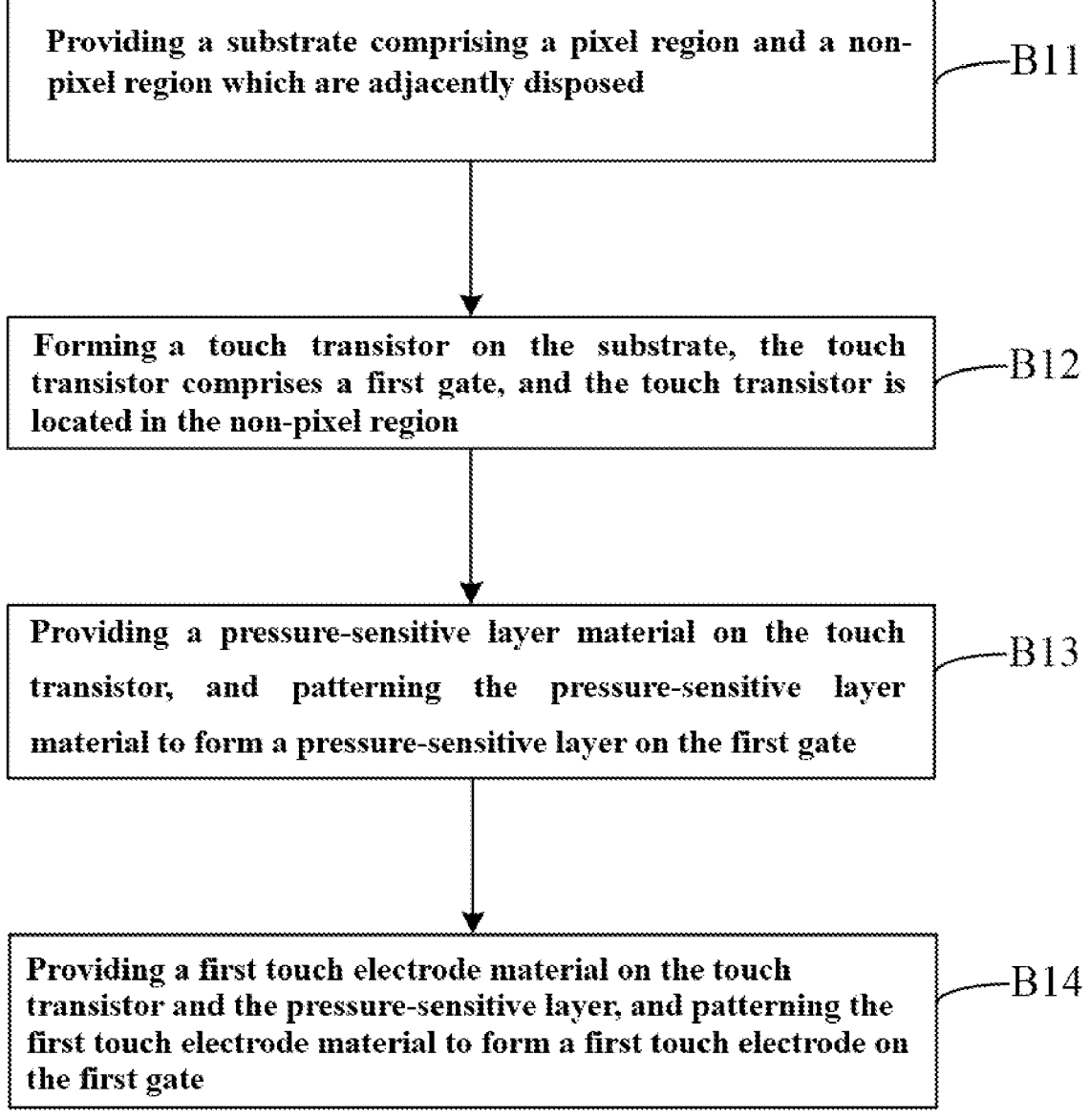

Providing a substrate comprising a pixel region and a non-pixel region which are adjacently disposed —B11

Forming a touch transistor on the substrate, the touch transistor comprises a first gate, and the touch transistor is located in the non-pixel region —B12

Providing a pressure-sensitive layer material on the touch transistor, and patterning the pressure-sensitive layer material to form a pressure-sensitive layer on the first gate —B13

Providing a first touch electrode material on the touch transistor and the pressure-sensitive layer, and patterning the first touch electrode material to form a first touch electrode on the first gate —B14

FIG. 5

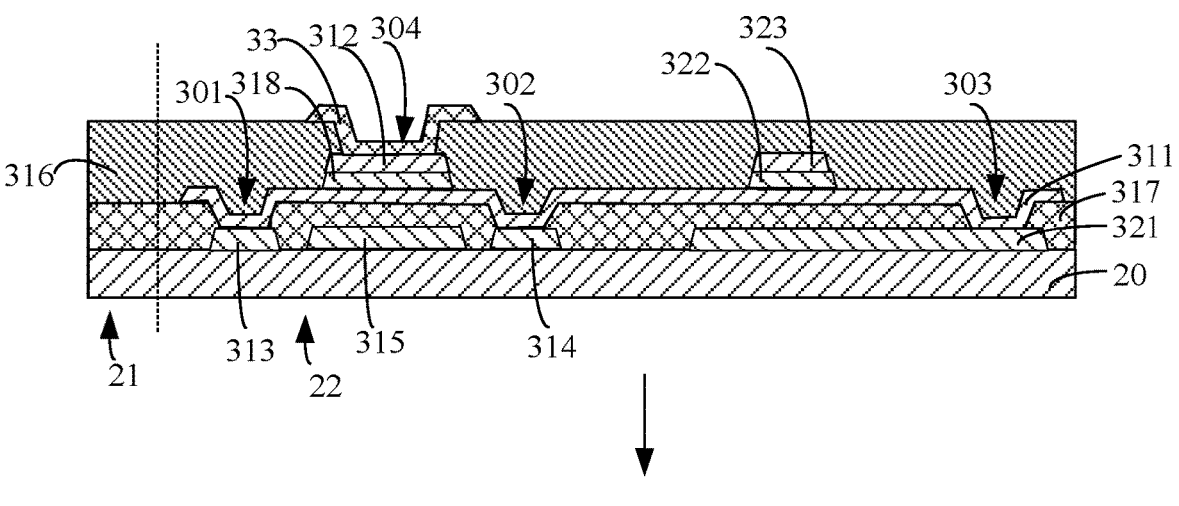
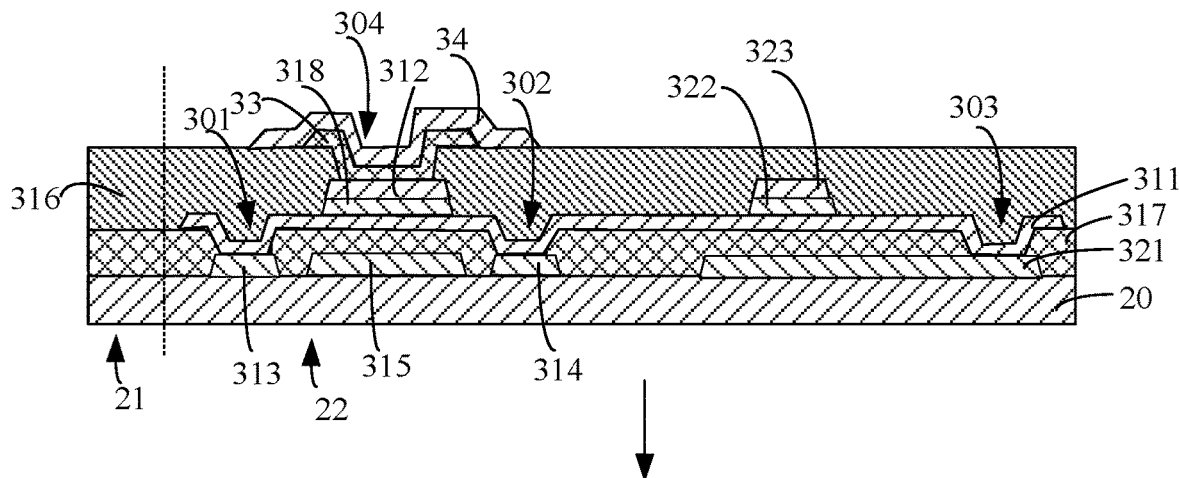
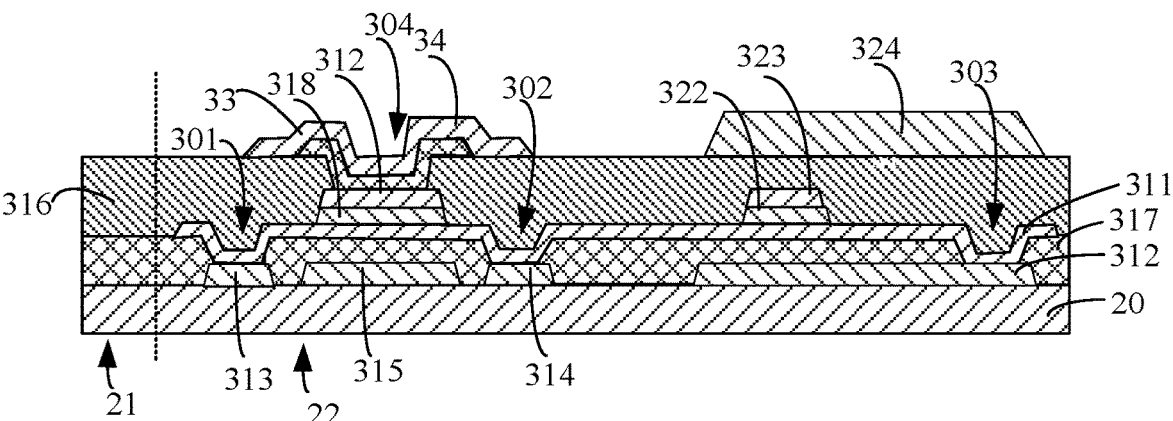
FIG. 7

ARRAY SUBSTRATE, PREPARATION METHOD THEREOF, AND DISPLAY PANEL

TECHNICAL FIELD

The present application relates to a technical field of display, and in particular, to an array substrate, a preparation method thereof, and a display panel.

BACKGROUND

With the development of display technology, it is also a trend to integrate a sensor into a display panel. Integrating a sensor, especially a touch sensor and a light sensor, into a display panel, can effectively improve loss of light efficiency and an increase of cost. However, current sensors are usually disposed in a pixel area, resulting in large signal crosstalk with the pixel area, thus reducing a signal-to-noise ratio.

Technical Problem

An embodiment of the present application provides an array substrate, a preparation method thereof, and a display panel, aiming at solving a problem of low signal-to-noise ratio of an array substrate.

Technical Solution

The present application provides an array substrate, comprising:
a substrate comprising a pixel region and a non-pixel region which are adjacently disposed; and
a touch unit disposed on the substrate, the touch unit is located in the non-pixel area, and the touch unit comprises:
a touch transistor disposed on the substrate, and the touch transistor comprises a first gate;
a pressure-sensitive layer disposed on the first gate; and
a first touch electrode disposed on the pressure-sensitive layer.
Optionally, in some embodiments of the present application, the first gate, the pressure-sensitive layer and the first touch electrode constitute a touch capacitor, and an orthographic projection of the touch capacitor on the substrate is located in an orthographic projection of the touch transistor on the substrate.
Optionally, in some embodiments of the present application, the array substrate further comprises a read transistor disposed in series with the touch transistor.
Optionally, in some embodiments of the present application, the orthographic projection of the touch transistor on the substrate is staggered from an orthographic projection of the read transistor on the substrate.
Optionally, in some embodiments of the present application, the touch transistor further comprises a first active portion, a first source, a first drain, a second gate, a buffer layer, and a first gate insulating portion, and the read transistor comprises a second source, a second gate insulating portion, and a third gate;
the first source, the second gate, the first drain and the second source are disposed in a same layer on the substrate at intervals; the second gate is located between the first source and the first drain, and the first drain is located between the second gate and the second source;
the buffer layer covers the substrate, the first source, the second gate, the first drain, and the second source;

the first active portion is disposed on the buffer layer and connected to the first source, the first drain and the second source;
the first gate insulating portion is disposed on the first active portion, and the first gate insulating portion is disposed above the second gate; the second gate insulating portion is disposed on the first active portion, and is disposed on the first active portion between the first drain and the second source, and the first gate insulating portion and the second gate insulating portion are disposed at intervals; and the first gate is disposed on the first gate insulating portion, and the third gate is disposed on the second gate insulating portion.
Optionally, in some embodiments of the present application, the touch transistor further comprises a first active portion, a second gate, a first source, a first drain, a passivation layer, a buffer layer, and a first gate insulating portion, and the read transistor comprises a second source, a second active portion, a second gate insulating portion, and a third gate;
the second gate is disposed on the substrate;
the buffer layer covers the substrate and the second gate;
the first active portion and the second active portion are disposed in a same layer on the buffer layer at intervals, and the first active portion is above the second gate;
the first gate insulating portion is disposed on the first active portion, and the second gate insulating portion is provided on the second active portion;
the first gate is disposed on the first gate insulating portion, and the third gate is disposed on the second gate insulating portion;
the passivation layer covers the buffer layer, the first active portion, the second active portion, the first gate insulating portion, the second gate insulating portion, the first gate and the third gate; and
the first source, the first drain and the second source are disposed in a same layer on the passivation layer at intervals, the first source is connected to one side of the first active portion, the first drain is connected to another side of the first active portion and one side of the second active portion, and the second source is connected to another side of the second active portion.
Optionally, in some embodiments of the present application, an orthographic projection of the touch transistor on the substrate overlaps an orthographic projection of the read transistor on the substrate.
Optionally, in some embodiments of the present application, the touch transistor further comprises a first active portion and a first drain connected to the first active portion, and the read transistor comprises a second active portion and a second drain connected to the second active portion and the first drain.
Optionally, in some embodiments of the present application, the touch transistor further comprises a planarization layer, a second gate, a first gate insulating portion, a first source and an interlayer dielectric layer, and the read transistor further comprises a second gate insulating portion, a third gate, a passivation layer and a second source;
the second active portion, the second gate insulating portion, and the third gate are stacked on the substrate in sequence;
the passivation layer covers the second active portion, the second gate insulating portion, the third gate and the substrate;
the second source and the second drain are disposed in a same layer on the passivation layer, the second source and the second drain are disposed at intervals and connected to the second active portion;

the second gate is disposed on the passivation layer and above the third gate;

the planarization layer covers the passivation layer and the second gate;

the first active portion, the first gate insulating portion, and the first gate are stacked on the planarization layer in sequence and positioned above the second gate;

the interlayer dielectric layer covers the planarization layer, the first active portion, the first gate insulating portion and the first gate; and the first source and the first drain are disposed in a same layer on the interlayer dielectric layer, the first source and the first drain are disposed at intervals, the first source is connected to one side of the first active portion, and the first drain is connected to the second drain and another side of the first active portion.

Correspondingly, the application also provides a display panel, which comprises an array substrate, and the array substrate comprises:

a substrate comprising a pixel region and a non-pixel region which are adjacently disposed; and a touch unit disposed on the substrate, the touch unit is located in the non-pixel area, and the touch unit comprises:

a touch transistor disposed on the substrate, and the touch transistor comprises a first gate;

a pressure-sensitive layer disposed on the first gate; and a first touch electrode disposed on the pressure-sensitive layer.

Optionally, in some embodiments of the present application, the first gate, the pressure-sensitive layer and the first touch electrode constitute a touch capacitor, and an orthographic projection of the touch capacitor on the substrate is located in an orthographic projection of the touch transistor on the substrate.

Optionally, in some embodiments of the present application, the array substrate further comprises a read transistor disposed in series with the touch transistor.

Optionally, in some embodiments of the present application, the orthographic projection of the touch transistor on the substrate is staggered from an orthographic projection of the read transistor on the substrate.

Optionally, in some embodiments of the present application, the touch transistor further comprises a first active portion, a first source, a first drain, a second gate, a buffer layer, and a first gate insulating portion, and the read transistor comprises a second source, a second gate insulating portion, and a third gate;

the first source, the second gate, the first drain and the second source are disposed on the substrate in a same layer at intervals; the second gate is located between the first source and the first drain, and the first drain is located between the second gate and the second source;

the buffer layer covers the substrate, the first source, the second gate, the first drain, and the second source;

the first active portion is provided on the buffer layer and connected to the first source, the first drain and the second source;

the first gate insulating portion is disposed on the first active portion, and the first gate insulating portion is disposed above the second gate; the second gate insulating portion is disposed on the first active portion, and is disposed on the first active portion between the first drain and the second source, and the first gate insulating portion and the second gate insulating portion are disposed at intervals; and the first gate is disposed on the first gate insulating portion, and the third gate is disposed on the second gate insulating portion.

Optionally, in some embodiments of the present application, the touch transistor further comprises a first active portion, a second gate, a first source, a first drain, a passivation layer, a buffer layer, and a first gate insulating portion, and the read transistor comprises a second source, a second active portion, a second gate insulating portion, and a third gate;

the second gate is disposed on the substrate;

the buffer layer covers the substrate and the second gate;

the first active portion and the second active portion are disposed in a same layer on the buffer layer at intervals, and the first active portion is above the second gate;

the first gate insulating portion is disposed on the first active portion, and the second gate insulating portion is provided on the second active portion;

the first gate is disposed on the first gate insulating portion, and the third gate is disposed on the second gate insulating portion;

the passivation layer covers the buffer layer, the first active portion, the second active portion, the first gate insulating portion, the second gate insulating portion, the first gate and the third gate; and the first source, the first drain and the second source are disposed in a same layer on the passivation layer at intervals, the first source is connected to one side of the first active portion, the first drain is connected to another side of the first active portion and one side of the second active portion, and the second source is connected to another side of the second active portion.

Optionally, in some embodiments of the present application, an orthographic projection of the touch transistor on the substrate overlaps an orthographic projection of the read transistor on the substrate.

Optionally, in some embodiments of the present application, the touch transistor further comprises a first active portion and a first drain connected to the first active portion, and the read transistor comprises a second active portion and a second drain connected to the second active portion and the first drain.

Optionally, in some embodiments of the present application, the touch transistor further comprises a planarization layer, a second gate, a first gate insulating portion, a first source and an interlayer dielectric layer, and the read transistor further comprises a second gate insulating portion, a third gate, a passivation layer and a second source;

the second active portion, the second gate insulating portion, and the third gate are stacked on the substrate in sequence;

the passivation layer covers the second active portion, the second gate insulating portion, the third gate and the substrate;

the second source and the second drain are disposed in a same layer on the passivation layer, the second source and the second drain are disposed at intervals and connected to the second active portion;

the second gate is disposed on the passivation layer and above the third gate;

the planarization layer covers the passivation layer and the second gate;

the first active portion, the first gate insulating portion, and the first gate are stacked on the planarization layer in sequence and positioned above the second gate;

the interlayer dielectric layer covers the planarization layer, the first active portion, the first gate insulating portion and the first gate; and the first source and the first drain are disposed in a same layer on the interlayer dielectric layer, the first source and the first drain are disposed at intervals, the first source is connected to one side of the first active portion, and the first drain is connected to the second drain and another side of the first active portion.

Correspondingly, the application also provides a method for preparing an array substrate, comprising steps of:

providing a substrate comprising a pixel region and a non-pixel region which are adjacently disposed;

forming a touch transistor on the substrate, the touch transistor comprises a first gate, and the touch transistor is located in the non-pixel region;

providing a pressure-sensitive layer material on the touch transistor, and patterning the pressure-sensitive layer material to form a pressure-sensitive layer on the first gate; and providing a first touch electrode material on the touch transistor and the pressure-sensitive layer, and patterning the first touch electrode material to form a first touch electrode on the first gate.

Optionally, in some embodiments of the present application, the step of forming a touch transistor on the substrate comprises:

providing a conductive material on the substrate, and patterning the conductive material to form a first source, a second gate, a first drain, and a second source disposed at intervals;

forming a buffer layer on the substrate, the first source, the second gate, the first drain, and the second source;

providing an active layer material on the buffer layer, and patterning the active layer to form a first active portion connected to the first source, the first drain, and the second source; and stacking a gate insulating layer material and a gate material in sequence on the buffer layer and the first active portion, patterning the gate insulating layer material and the gate material to form a first gate insulating portion, a second gate insulating portion, a first gate and a third gate, the first gate insulating portion and the second gate insulating portion are disposed at intervals, the first gate insulating portion is located above the second gate, the second gate insulating portion is located between the first drain and the second source, the first gate is located on the first gate insulating portion, and the third gate is located on the second gate insulating portion.

Technical Effects

The present application discloses an array substrate and a preparation method and a display panel. The array substrate comprises a substrate and a touch unit. The substrate comprises a pixel region and a non-pixel region which are adjacently disposed. The touch unit is disposed on the substrate, and is located in the non-pixel region, the touch unit comprises a touch transistor, a pressure-sensitive layer and a first touch electrode, wherein the touch transistor is disposed on the substrate, and the touch transistor comprises a first gate, the pressure-sensitive layer is disposed on the first gate, and the first touch electrode is disposed on the pressure-sensitive layer. The first gate, the pressure-sensitive layer and the first touch electrode constitute a touch capacitor. In the present application, the first gate of the touch transistor and a second touch electrode of the touch capacitor share a layer of metal, that is, the first gate is multiplexed into the second touch electrode, and the second touch electrode is used to convert a touch signal into an electrical signal. Therefore, it is equivalent to change in potential of the second touch electrode directly acting on the first gate, thereby avoiding a need for an intermediate signal line to be connected and transmitted through, reducing the loss of touch signals, and further improving a signal-to-noise ratio of the array substrate. The first gate of the touch transistor is multiplexed into the second touch electrode of the touch capacitor, so that when touched, a change in charge amount of the touch capacitor causes a change in voltage of the first gate, thereby changing the current magnitude of the touch transistor. The touch unit is composed of a read transistor and a touch transistor connected to the touch capacitor, and is located in the non-pixel area, so that signal crosstalk between the touch capacitor and the pixel area can be reduced, and the touch transistor and the read transistor can be prepared together with the driving transistor process of the pixel area without adding other processes, thereby simplifying the preparation process of the array substrate. The orthographic projection of the touch capacitor on the substrate is located in the orthographic projection of the touch transistor on the substrate, and the touch capacitor is disposed directly above the touch transistor, so that metal in the touch capacitor does not overlap with other areas, thereby reducing the coupling influence of the touch capacitor and other capacitors. The touch transistor and the read transistor are connected in series, so that the touch transistor and the read transistor are used as resistors. Under the condition that the total voltage difference between Vdd and Vss is constant, the voltage on the touch transistor serving as a variable resistor can be read out by using a voltage division principle of the two transistors in series, that is, change in current of the first gate under the influence of touch will be read by Vout between the touch transistor and the reading transistor.

BRIEF DESCRIPTION OF THE DRAWINGS

In order to more clearly describe the technical solutions in the embodiments of the present application, hereinafter, the appended drawings used for describing the embodiments will be briefly introduced. Apparently, the appended drawings described below are only directed to some embodiments of the present application, and for a person skilled in the art, without expenditure of creative labor, other drawings can be derived on the basis of these appended drawings.

FIG. 5 is a schematic flowchart of a method for preparing an array substrate provided by an embodiment of the present application.

FIG. 7 is a schematic diagram of a second flow structure of a method for preparing an array substrate provided by an embodiment of the present application.

DETAILED DESCRIPTION

Figures 1, 2:
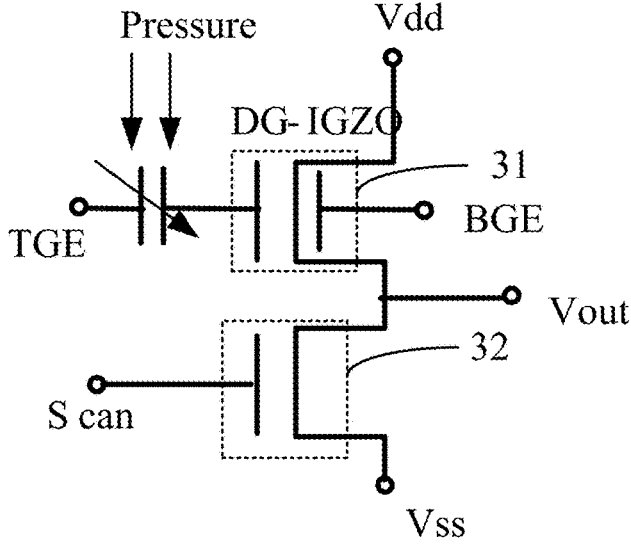
FIG. 1 is a schematic circuit diagram of an array substrate provided by an embodiment of the present application.
FIG. 2 is a schematic diagram of a first structure of an array substrate provided by an embodiment of the present application.

Hereinafter, technical solution in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application. In addition, it should be understood that the specific embodiments described herein are intended only to illustrate and explain the present application, and are not intended to limit the present application. In the present application, unless otherwise stated, the directional words such as "up" and "down" used usually refer to the up and down of the device in actual use or working state, specifically the drawing direction in the drawings; while "inside" and "outside" are in terms of the outline of the device. In the present application, "reaction" can be a chemical reaction or a physical reaction.

An embodiment of the present application provides an array substrate, a preparation method thereof, and a display panel.

The present application provides an array substrate, the array substrate comprises a substrate and a touch unit, wherein the substrate comprises a pixel region and a non-pixel region which are adjacently disposed, the touch unit is disposed on the substrate, and is located in the non-pixel region, and the touch unit comprises a touch transistor, a pressure-sensitive layer and a first touch electrode, wherein the touch transistor is disposed on the substrate, and the touch transistor comprises a first gate, the pressure-sensitive layer is disposed on the first gate, and the first touch electrode is disposed on the pressure-sensitive layer.

The first gate, the pressure-sensitive layer and the first touch electrode constitute a touch capacitor. In the present application, the first gate of the touch transistor and a second touch electrode of the touch capacitor share a layer of metal, that is, the first gate is multiplexed into the second touch electrode, and the second touch electrode is used to convert a touch signal into an electrical signal. Therefore, it is equivalent to a change in potential of the second touch electrode directly acting on the first gate, thereby avoiding a need for an intermediate signal line to be connected to and transmitted through, reducing a loss of touch signals, and further improving a signal-to-noise ratio of the array substrate. The first gate of the touch transistor is multiplexed into the second touch electrode of the touch capacitor, so that when touched, a change in charge amount of the touch capacitor causes a change in voltage of the first gate, thereby changing the current magnitude of the touch transistor. The touch unit is composed of a read transistor and a touch transistor connected to the touch capacitor, and is located in the non-pixel area, so that signal crosstalk between the touch capacitor and the pixel area can be reduced, and the touch transistor and the read transistor can be prepared together with the driving transistor process of the pixel area without adding other processes, thereby simplifying the preparation process of the array substrate.

Details are given below.

Referring to FIG. 1 and FIG. 2. FIG. 1 is a schematic circuit diagram of an array substrate provided by an embodiment of the present application. FIG. 2 is a schematic diagram of a first structure of an array substrate provided by an embodiment of the present application. The present application provides an array substrate, the array substrate 10 comprises a substrate 20 and a touch unit 30. The substrate 20 comprises a pixel region 21 and a non-pixel region 22 which are adjacently disposed. The touch unit 30 is located in the non-pixel area 22, and the touch unit 30 comprises a touch transistor 31, a read transistor 32, a pressure-sensitive layer 33, and a first touch electrode 34. The touch transistor 31 and the read transistor 32 are disposed in series. The touch transistor 31 comprises a first active portion 311, a first gate 312, a first source 313, a first drain 314, a second gate 315, a passivation layer 316, a buffer layer 317, and a first gate insulating portion 318. The first gate 312, the pressure-sensitive layer 33, and the first touch electrode 34 constitute a touch capacitor. The read transistor 32 comprises a first active portion 311, a first drain 314, a second source 321, a second gate insulating portion 322, a third gate 323, and a light shielding layer 324. An orthographic projection of the touch capacitor on the substrate 20 is located in an orthographic projection of the touch transistor 31 on the substrate 20. An orthographic projection of the touch transistor 31 on the substrate 20 is staggered from an orthographic projection of the read transistor 32 on the substrate 20.

Specifically, the first source 313, the second gate 315, the first drain 314, and the second source 321 are disposed in a same layer on the substrate 20 at intervals. The second gate 315 is located between the first source 313 and the first drain 314. The first drain 314 is located between the second gate 315 and the second source 321. Materials of the first source 313, the second gate 315, the first drain 314, and the second source 321 comprise one or more combination of Mo, Al, Ti and Cu.

The buffer layer 317 covers the substrate 20, the first source 313, the second gate 315, the first drain 314, and the second source 321. The buffer layer 317 is defined with a first through hole 301, a second through hole 302, and a third through hole 303. The first through hole 301 penetrates the buffer layer 317 to expose the first source 313. The second through hole 302 penetrates the buffer layer 317 to expose the first drain 314. The third through hole 303 penetrates the buffer layer 317 to expose the second source 321. Materials of the buffer layer 317 comprise one or more combination of silicon nitride, silicon oxynitride and silicon oxide.

The first active portion 311 is disposed on the buffer layer 317, and extends into the first through hole 301, the second through hole 302, and the third through hole 303, and is connected to the first source 313, the first drain 314, and the second source 321. A part of the first active portion 311 connected to the first source 313, the first drain 314, and the second source 321 is a conductive first active portion 311. That is, the touch transistor 31 and the read transistor 32 share a layer of the first active portion 311. Materials of the first active portion 311 comprise at least one of ZnO (zinc oxide), ITZO (indium tin zinc oxide), ITZTO (indium tin zinc tin oxide), IZO (indium zinc oxide), ZTO (zinc tin oxide), and IGZO (indium gallium zinc oxide).

The first gate insulating portion 318 is disposed on the first active portion 311, and the first gate insulating portion 318 is disposed above the second gate 315. The second gate insulating portion 322 is disposed on the first active portion 311, and is disposed on the first active portion 311 between the first drain 314 and the second source 321. The first gate insulating portion 318 and the second gate insulating portion 322 are disposed at intervals. Materials of the first gate insulating portion 318 and the second gate insulating portion 322 each comprise one or more combination of silicon nitride, silicon oxynitride and silicon oxide.

The first gate 312 is disposed on the first gate insulating portion 318. The third gate 323 is disposed on the second gate insulating portion 322. Materials of the first gate 312 and the second gate 315 comprise one or more combination of Mo, Al, Ti and Cu. The touch transistor comprises the first active portion 311, the first gate 312, the first source 313, the first drain 314, the second gate 315, the passivation layer 316, the buffer layer 317, and the first gate insulating portion 318. That is, the touch transistor 31 is a dual-gate touch transistor 31. The read transistor 32 is a single-gate read transistor 32.

In the present application, the first gate 312 of the touch transistor 31 is multiplexed into the second touch electrode of the touch capacitor. According to the principle of charge conservation, under a condition that a charge quantity Q of a capacitance is constant, according to Q=CU, the dielectric constant of the touch capacitance changes due to pressure, so that a voltage of the two poles of the touch capacitance C also changes. Further, the second touch electrode in the touch capacitor is the first gate 312 of the touch transistor 31, which will change the potential of the first gate 312 to change the current of the touch transistor 31, so as to realize touch performance. That is, the first gate 312 of the touch transistor 31 is multiplexed into the second touch electrode of the touch capacitor, so that a change in charge amount of the touch capacitor causes a change in voltage of the first gate 312, thereby changing a current magnitude of the touch transistor 31.

In another embodiment, the touch transistor 31 may also be a single-gate touch transistor 31. When the single-gate touch transistor can be a top-gate touch transistor, the touch capacitor is located directly above the top-gate transistor; when the single-gate touch transistor can be a bottom-gate touch transistor, the touch capacitor is located directly below the bottom-gate transistor.

The passivation layer 316 covers the first active portion 311, the first gate insulating portion 318, the second gate insulating portion 322, the first gate 312, and the third gate 323. The passivation layer 316 is defined with a fourth through hole 304. The fourth through hole 304 penetrates the passivation layer 316 to expose the first gate 312. Materials of the passivation layer 316 comprises one or more combination of silicon nitride, silicon oxynitride and silicon oxide.

The pressure-sensitive layer 33 is disposed on the passivation layer 316, and extends into the fourth through hole 304 to be connected to the first gate 312. The pressure-sensitive layer 33 may be formed by stacking one or more layers. Materials of the pressure-sensitive layer 33 comprise one or any combination of an organic compound and an inorganic compound. Materials of the pressure-sensitive layer 33 comprise one or any combination of polyvinylidene difluoride (PVDF), polyvinylidene fluorotriene, and lead zirconate titanate (PZT). A thickness W of the pressure-sensitive layer 33 is 3-10 microns. Specifically, the thickness W of the pressure sensitive layer 33 may be 3 microns, 5 microns, 6 microns, 8 microns, 10 microns, etc. The thickness W of the pressure-sensitive layer 33 is provided as 3-10 microns to improve the pressure-sensitive effect, film adhesion, and deformation change percentage, thereby improving the performance of the touch unit 30.

In an embodiment, materials of the pressure-sensitive layer 33 is doped with one or a combination of zirconium and titanium, and materials of the pressure-sensitive layer 33 is doped with zirconium and titanium in a mass fraction of 5%-10%. Specifically, the mass fraction of zirconium and titanium doped in the material of the pressure-sensitive layer 33 may be 5%, 6%, 7.4%, 8%, or 10%. The mass fraction of the material of the pressure-sensitive layer 33 doped with zirconium and titanium is provided as 5%-10% to improve performance of the pressure-sensitive layer 33, thereby improving the touch performance of the touch transistor 31. If the doping content is too high, the pressure-sensitive layer 33 will be too brittle, causing the pressure-sensitive layer 33 to be easily broken during touching; if the doping content is too low, the pressure-sensitive layer 33 will have poor pressure-sensitive characteristics, which will further affect the performance of the touch transistor 31.

The first touch electrode 34 is disposed on the passivation layer 316 and the pressure-sensitive layer 33. Materials of the first touch electrode 34 comprise a transparent metal oxide material. Specifically, materials of the first touch electrode 34 comprise one or a combination of ITO and IZO. The first gate 312, the pressure-sensitive layer 33 and the first touch electrode 34 constitute a touch capacitor. The orthographic projection of the touch capacitor on the substrate 20 is disposed in the orthographic projection of the touch transistor 31 on the substrate 20, and the touch capacitor is located directly above the touch transistor 31.

The light shielding layer 324 is disposed on the passivation layer 316 and is located above the reading transistor 32. The orthographic projection of the light shielding layer 324 on the substrate 20 covers the orthographic projection of the reading transistor 32 on the substrate 20. The light shielding layer 324 is disposed such that its orthographic projection on the substrate 20 covering the orthographic projection of the reading transistor 32 on the substrate 20, so that the light affects the reading transistor 32, thereby improving the performance of the reading transistor 32, and thereby increasing the performance of the array substrate 10.

Working principle of a circuit is as follows:

In the circuit, a high voltage is input at Vdd, and a negative voltage is input at BGE and scan, so that the touch transistor 31 and the read transistor 32 are both turned off at a same time, which can be regarded as two resistors. The touch transistor 31 is subjected to pressure as a variable resistor and the read transistor 32 is a constant resistor. On the premise that the voltage at Vdd is constant, voltage between Vdd and Vss is constant, and change in voltage will cause change in the resistance of the touch transistor 31, thereby causing change in the output voltage at Vout, thereby realizing controlling by touch.

In the present application, the first gate 312 of the touch transistor 31 and a second touch electrode of the touch capacitor share a layer of metal, that is, the first gate 312 is multiplexed into the second touch electrode, and the second touch electrode is used to convert a touch signal into an electrical signal. Therefore, it is equivalent to a change in potential of the second touch electrode directly acting on the first gate 312, thereby avoiding a need for an intermediate signal line to be connected to and transmitted through, reducing a loss of touch signals, and further improving a signal-to-noise ratio of the array substrate 10. The first gate 312 of the touch transistor 31 is multiplexed into the second touch electrode of the touch capacitor, so that when touched, a change in charge amount of the touch capacitor causes change in voltage of the first gate 312, thereby changing the current magnitude of the touch transistor 31. The touch unit 30 is composed of a read transistor 32 and a touch transistor 31 connected to the touch capacitor, and is located in the non-pixel area 22, so that signal crosstalk between the touch capacitor and the pixel area 21 can be reduced, and the touch transistor 31 and the read transistor 32 can be prepared together with the driving transistor process of the pixel area 21 without adding other processes, thereby simplifying the preparation process of the array substrate 10. The orthographic projection of the touch capacitor on the substrate 20 is located in the orthographic projection of the touch transistor 31 on the substrate 20, and the touch capacitor is disposed directly above the touch transistor 31, so that metal in the touch capacitor does not overlap with other areas, thereby reducing the coupling influence of the touch capacitor and other capacitors, and thus improving the signal-to-noise ratio of the array substrate 10. The touch transistor 31 is connected in series with the read transistor 32 through the first active portion 311, so that the touch transistor 31 and the read transistor 32 are used as resistors. Under the condition that the total voltage difference between Vdd and Vss is constant, the voltage on the touch transistor 31 serving as a variable resistor can be read out by using a voltage division principle of two transistors in series, that is, change in current of the first gate 312 under the influence of touch will be read by Vout between the touch transistor 31 and the reading transistor 32.

Figure 3:
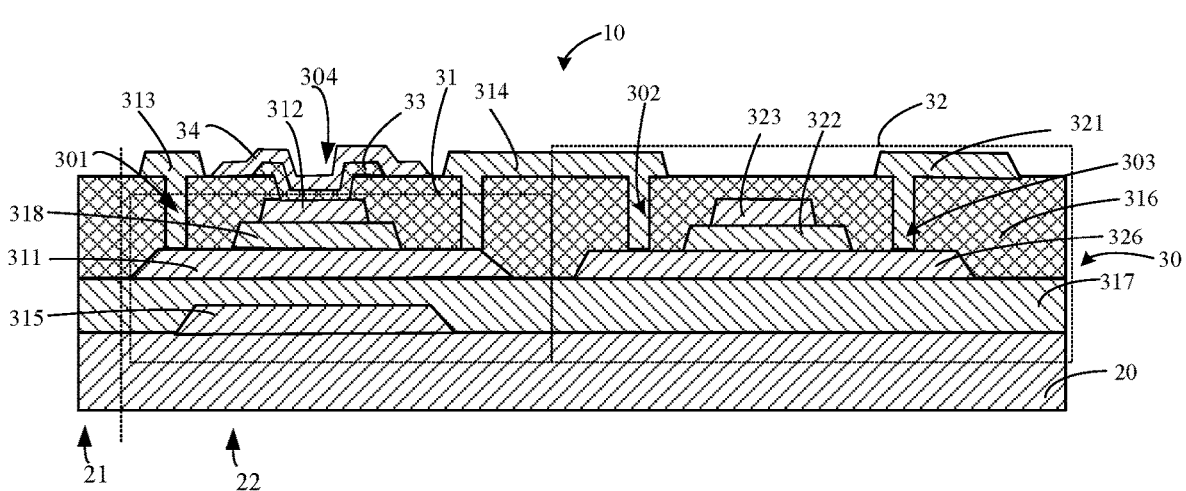
FIG. 3 is a schematic diagram of a second structure of an array substrate provided by an embodiment of the present application.

Referring to FIG. 3, which is a schematic diagram of a second structure of an array substrate provided by an embodiment of the present application. It should be noted that the second structure differs from the first structure in that:

The first source 313, the first drain 314, the second source 321, and the second gate 315 are disposed in different layers. The first active portion 311 is disposed in the touch transistor 31, and the second active portion 326 is disposed in the read transistor 32. The first active portion 311 and the second active portion 326 are disposed in a same layer at intervals. The series connection between the touch transistor 31 and the read transistor 32 is formed by connecting the first active portion 311 and the second active portion 326 through the first drain 314.

Specifically, the second gate 315 is disposed on the substrate 20. The buffer layer 317 covers the substrate 20 and the second gate 315. The first active portion 311 and the second active portion 326 are disposed on the buffer layer 317 in a same layer at intervals. The first active portion 311 is disposed above the second gate 315. The first gate insulating portion 318 and the first gate 312 are sequentially stacked on the first active portion 311. The second gate insulating portion 322 and the third gate 323 are sequentially stacked on the second active portion 326.

The passivation layer 316 covers the buffer layer 317, the first active portion 311, the second active portion 326, the first gate insulating portion 318, the second gate insulating portion 322, the first gate 312, and the third gate 323. The first through hole 301 exposes one side of the first active portion 311. The second through hole 302 exposes another side of the first active portion 311 and one side of the second active portion 326. The third through hole 303 exposes another side of the second active portion 326.

The first source 313 extends into the first through hole 301 and is connected to one side of the first active portion 311. The first drain 314 extends into the second through hole 302 and is connected to another side of the first active portion 311 and one side of the second active portion 326. The second source 321 extends into the third through hole 303 and is connected to another side of the second active portion 326. Other structures are same as those of the first structure and are not described here.

In the present application, the orthographic projection of the touch capacitor on the substrate 20 is located in the orthographic projection of the touch transistor 31 on the substrate 20, so that metal in the touch capacitor does not overlap with other areas, thereby reducing the coupling influence of the touch capacitor and other capacitors, and thus improving the signal-to-noise ratio of the array substrate 10. The touch transistor 31 is connected in series with the read transistor 32 by using the first drain 314, so that the touch transistor 31 and the read transistor 32 are used as resistors. Under the condition that the total voltage difference between Vdd and Vss is constant, the voltage on the touch transistor 31 serving as a variable resistor can be read out by using a voltage division principle of two transistors in series, that is, change in current of the first gate 312 under the influence of touch will be read by Vout between the touch transistor 31 and the reading transistor 32.

Figure 4:
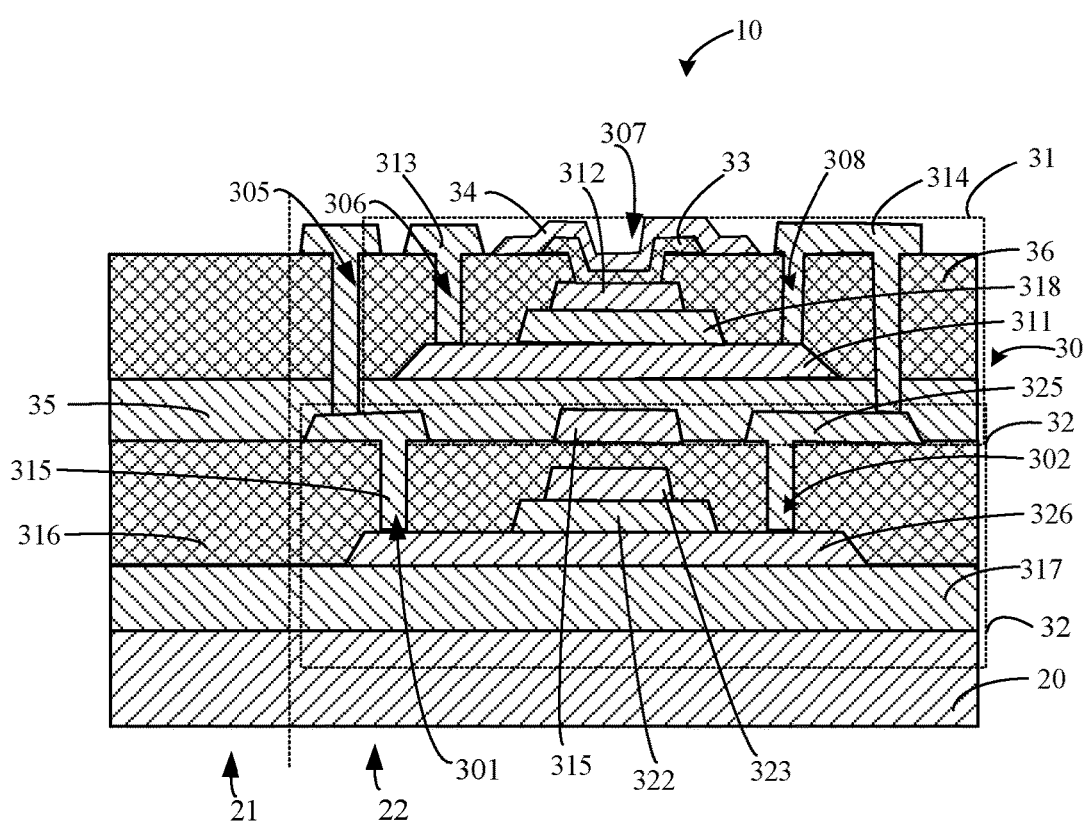
FIG. 4 is a schematic diagram of a third structure of an array substrate provided by an embodiment of the present application.

Referring to FIG. 4, FIG. 4 is a schematic diagram of a third structure of an array substrate provided by an embodiment of the present application. It should be noted that the third structure differs from the first structure in that:

The orthographic projection of the touch transistor 31 on the substrate 20 overlaps an orthographic projection of the read transistor 32 on the substrate 20, and the touch capacitor is located on the touch transistor 31, and the touch transistor 31 is located above the read transistor 32. The touch transistor 31 further comprises a first drain 314 connected to the first active portion 311. The read transistor 32 further comprises a second active portion 326 and a second drain 325. The first active portion 311 and the second active portion 326 are not connected, and the second drain 325 is connected to the second active portion 326 and the first drain 314. A light shielding layer 324 is not disposed above the read transistor 32.

Specifically, the buffer layer 317 is disposed on the substrate 20. The second active portion 326, the second gate insulating portion 322, and the third gate 323 are sequentially stacked on the buffer layer 317.

The passivation layer 316 covers the second active portion 326, the second gate insulating portion 322, the third gate 323, and the substrate 20. The passivation layer 316 is defined with a first through hole 301 and a second through hole 302. The first through hole 301 penetrates the passivation layer 316 to expose one side of the second active portion 326. The second through hole 302 penetrates the passivation layer 316 to expose another side of the second active portion 326.

The second source 321, the second gate 315, and the second drain 325 are disposed in a same layer on the passivation layer 316, and a first sub-source of the second source 321, the second gate 315, and the second drain 325 are disposed at intervals. The second source 321 extends into the first through hole 301 and is connected to the one side of the second active portion 326. The second gate 315 is disposed between the first sub-source of the second source 321 and the second drain 325 and above the third gate 323. The second drain 325 is connected to another side of the second active portion 326.

The planarization layer 35 covers the first sub-source of the second source 321, the second drain 325, the passivation layer 316, and the second gate 315.

The first active portion 311, the first gate insulating portion 318, and the first gate 312 are sequentially stacked on the planarization layer 35 and positioned above the second gate 315.

The interlayer dielectric layer 36 covers the planarization layer 35, the first active portion 311, the first gate insulating portion 318, and the first gate 312. The interlayer dielectric layer 36 is defined with a first connection hole 305, a second connection hole 306, a third connection hole 307, and a fourth connection hole 308. The first connection hole 305 penetrates the interlayer dielectric layer 36 and the planarization layer 35 to expose a second sub-source of the second source 321. The second connection hole 306 penetrates the interlayer dielectric layer 36 to expose one side of the first active portion 311. The third connection hole 307 penetrates the interlayer dielectric layer 36 to expose the first gate 312. The fourth connection hole 308 penetrates the interlayer dielectric layer 36 to expose another side of the first active portion 311, and penetrates the interlayer dielectric layer 36 and the planarization layer 35 to expose the second drain 325.

The first source 313 and the first drain 314 are disposed in a same layer on the interlayer dielectric layer 36, and the first source 313 and the first drain 314 are disposed at intervals. The first source 313 is connected to one side of the first active portion 311, and the first drain 314 is connected to the second drain 325 and another side of the first active portion 311.

The pressure-sensitive layer 33 is disposed on the interlayer dielectric layer 36 and extends into the third connection hole 307 to connect to the first gate 312.

Other structures are same as those of the first structure and are not described here.

In another embodiment, the touch transistor 31 is below the read transistor 32, and the touch capacitor is located between the touch transistor 31 and the read transistor 32.

In the present application, an orthographic projection of the touch transistor 31 on the substrate 20 is disposed to overlap the orthographic projection of the read transistor 32 on the substrate 20, and the touch transistor 31 and the read transistor 32 are connected in series through the first drain 314, thereby reducing an area occupied by the touch unit 30 in the non-pixel region 22. The touch transistor 31 and the read transistor 32 are connected in series by using the first drain 314, so that the touch transistor 31 and the read transistor 32 are used as resistors. Under the condition that the total voltage difference between Vdd and Vss is constant, the voltage on the touch transistor 31 serving as a variable resistor can be read out by using a voltage division principle of the two transistors in series, that is, change in current of the first gate 312 under the influence of touch will be read by Vout between the touch transistor 31 and the reading transistor 32.

The present application provides an array substrate 10, the first gate 312 of the touch transistor 31 and a second touch electrode of the touch capacitor share a layer of metal, that is, the first gate 312 is multiplexed into the second touch electrode, and the second touch electrode is used to convert a touch signal into an electrical signal. Therefore, it is equivalent to a change in potential of the second touch electrode directly acting on the first gate 312, thereby avoiding a need for an intermediate signal line to be connected to and transmitted through, reducing the loss of touch signals, and further improving a signal-to-noise ratio of the array substrate 10. The first gate 312 of the touch transistor 31 is multiplexed into the second touch electrode of the touch capacitor, so that a change in charge amount of the touch capacitor causes change in voltage of the first gate 312, thereby changing the current magnitude of the touch transistor 31. The touch unit 30 is composed of a read transistor 32 and a touch transistor 31 connected to the touch capacitor, and is located in a non-pixel area 22, so that signal crosstalk between the touch capacitor and the pixel area 21 can be reduced, and the touch transistor 31 and the read transistor 32 can be completed together with the driving transistor process of the pixel area 21 without adding other processes, thereby simplifying the preparation process of the array substrate 10. The orthographic projection of the touch capacitor on the substrate 20 is located in the orthographic projection of the touch transistor 31 on the substrate 20, and the touch capacitor is disposed directly above the touch transistor 31, so that metal in the touch capacitor does not overlap with other areas, thereby reducing the coupling influence of the touch capacitor and other capacitors. The touch transistor 31 and the read transistor 32 are connected in series, so that the touch transistor 31 and the read transistor 32 are used as resistors. Under the condition that the total voltage difference between Vdd and Vss is constant, the voltage on the touch transistor 31 serving as a variable resistor can be read out by using a voltage division principle of the two transistors in series, that is, change in current of the first gate 312 under the influence of touch will be read by Vout between the touch transistor 31 and the reading transistor 32. An orthographic projection of the touch transistor 31 on the substrate 20 is disposed to overlap the orthographic projection of the read transistor 32 on the substrate 20, and the touch transistor 31 and the read transistor 32 are connected in series through the first drain 314, thereby reducing an area occupied by the touch unit 30 in the non-pixel region 22.

The present application further provides a display panel, which comprises an array substrate provided in the present application.

The present application further provides a method for preparing an array substrate, comprising steps of:

B11: providing a substrate comprising a pixel region and a non-pixel region which are adjacently disposed;

B12: forming a touch transistor on the substrate, the touch transistor comprises a first gate, and the touch transistor is located in the non-pixel region;

B13: providing a pressure-sensitive layer material on the touch transistor, and patterning the pressure-sensitive layer material to form a pressure-sensitive layer on the first gate; and B14: providing a first touch electrode material on the touch transistor and the pressure-sensitive layer, and patterning the first touch electrode material to form a first touch electrode on the first gate.

Details are given below.

Referring to FIG. 5, FIG. 5 is a flowchart of a method for preparing an array substrate provided by an embodiment of the present application. The present application further provides a method for preparing an array substrate, comprising steps of:

B11: providing a substrate comprising a pixel region and a non-pixel region which are adjacently disposed.

Please continue to refer to FIG. 2.

B12: forming a touch transistor on the substrate, the touch transistor comprises a first gate, and the touch transistor is located in the non-pixel region.

Figure 6:
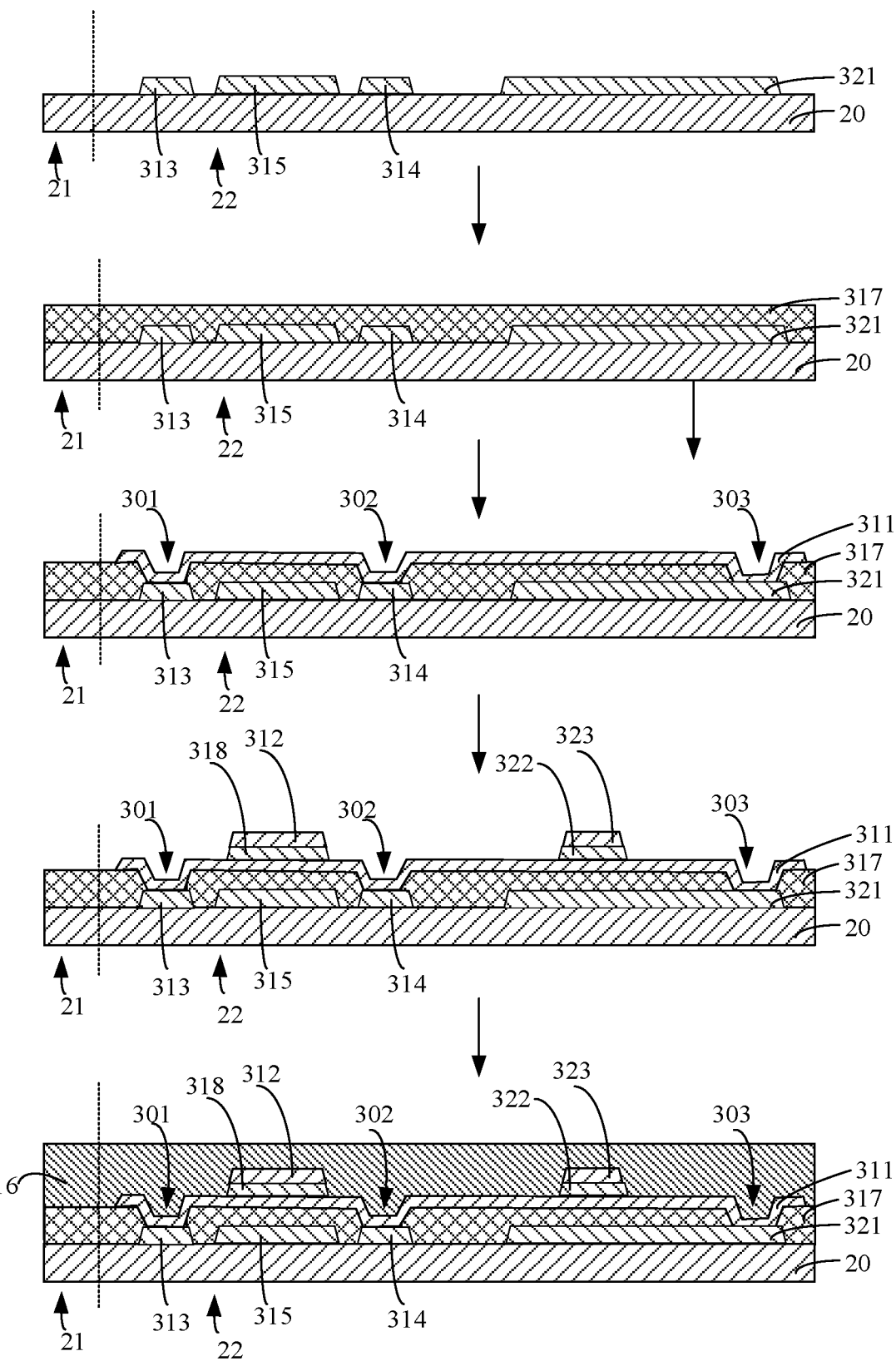
FIG. 6 is a schematic diagram of a first flow structure of a method for preparing an array substrate provided by an embodiment of the present application.

Please refer to FIG. 6. Conductive materials are sputtered on the substrate 20 by physical vapor deposition process, and the conductive materials are patterned to form the first source 313, the second gate 315, the first drain 314, and the second source 321, disposed at intervals.

Please continue to refer to FIG. 6. A material of buffer layer 317 is sputtered on the substrate the first source 313, the second gate 315, the first drain 314, and the second source 321 by a chemical vapor deposition process, and annealed and patterned to form the buffer layer 317. The annealing temperature is 300-400° C. and the annealing time is 2-3 h. By annealing the buffer layer 317, oxygen defects in the buffer layer 317 and interface defects between the buffer layer 317 and the subsequent first active portion 311 and the second active portion 326 can be reduced, thereby improving stability of the touch transistor 31 and the read transistor, thereby improving performance of the array substrate 10.

In an embodiment, the annealing temperature may be 300° C., 330° C., 360° C., 380° C., 400° C., etc. The annealing time can be 2 h, 2.4 h, 2.7 h, 3 h, etc. When the annealing temperature is set to 300-400° C. and the annealing time is 2-3 h, the oxygen defects in the buffer layer 317 and the interface defects between the buffer layer 317 and the subsequent first active portion 311 and the second active portion 326 are further reduced, thereby improving the stability of the touch transistor 31 and the read transistor, thereby improving the performance of the array substrate 10.

Please continue to refer to FIG. 6. An active layer material is provided on the buffer layer 317, and the active layer material is patterned to form a first active portion 311 connected to the first source 313, the first drain 314, and the second source 321. The first active portion 311 comprises a semiconductive first active portion 311 and a conductive first active portion 311, and the conductive first active portion 311 is connected to the first source 313, the first drain 314, and the second source 321 through the first through hole 301, the second through hole 302, and the third through hole 303.

Please continue to refer to FIG. 6. Depositing a gate insulating layer material and a gate material sequentially on the substrate 20, the first active portion 311, and the second active portion 326, and patterning the gate material to form the first gate 312 and the third gate 323; Then, the gate insulating layer material is patterned by using a self-alignment process of the first gate 312 and the third gate 323 to form the first gate insulating portion 318 and the second gate insulating portion 322 disposed at intervals. Then, the first active portion 311 is processed by a plasma process to form a semiconductive first active portion 311 and a conductive first active portion 311.

Please continue to refer to FIG. 6. A passivation layer material is deposited on the first gate 312 and the third gate 323 by a chemical vapor deposition process, and patterned to form the passivation layer 316.

B13: providing a pressure-sensitive layer material on the touch transistor, and patterning the pressure-sensitive layer material to form a pressure-sensitive layer on the first gate.

Please continue to refer to FIG. 6. A material of pressure-sensitive layer 33 is deposited or coated on the passivation layer 316 and the first gate 312, and patterned to form the pressure-sensitive layer 33.

B14: providing a first touch electrode material on the touch transistor and the pressure-sensitive layer, and patterning the first touch electrode material to form a first touch electrode on the first gate Referring to FIG. 7, a material of the first touch electrode 34 is disposed on the passivation layer 316 and the pressure-sensitive layer 33, and the first touch electrode 34 is patterned.

Please continue to refer to FIG. 7. A material of light shielding layer 324 is provided on the pressure-sensitive layer 33 and the passivation layer 316, and patterned to form the light shielding layer 324.

The present application discloses an array substrate, a preparation method thereof, and a display panel. The first gate 312 of the touch transistor 31 and a second touch electrode of the touch capacitor share a layer of metal, that is, the first gate 312 is multiplexed into the second touch electrode, and the second touch electrode is used to convert a touch signal into an electrical signal. Therefore, it is equivalent to a change in potential of the second touch electrode directly acting on the first gate 312, thereby avoiding a need for an intermediate signal line to be connected to and transmitted through, reducing a loss of touch signals, and further improving a signal-to-noise ratio of the array substrate 10. The first gate 312 of the touch transistor 31 is multiplexed into the second touch electrode of the touch capacitor, so that when touched, a change in charge amount of the touch capacitor causes a change in voltage of the first gate 312, thereby changing the current magnitude of the touch transistor 31. The touch unit 30 is composed of a read transistor 32 and a touch transistor 31 connected to the touch capacitor, and is located in the non-pixel area 22, so that signal crosstalk between the touch capacitor and the pixel area 21 can be reduced, and the touch transistor 31 and the read transistor 32 can be prepared together with the driving transistor process of the pixel area 21 without adding other processes, thereby simplifying the preparation process of the array substrate 10. The orthographic projection of the touch capacitor on the substrate 20 is located in the orthographic projection of the touch transistor 31 on the substrate 20, and the touch capacitor is disposed directly above the touch transistor 31, so that metal in the touch capacitor does not overlap with other areas, thereby reducing the coupling influence of the touch capacitor and other capacitors. The touch transistor 31 and the read transistor 32 are connected in series, so that the touch transistor 31 and the read transistor 32 are used as resistors. Under the condition that the total voltage difference between Vdd and Vss is constant, the voltage on the touch transistor 31 serving as a variable resistor can be read out by using a voltage division principle of two transistors in series, that is, change in current of the first gate 312 under the influence of touch will be read by Vout between the touch transistor 31 and the reading transistor 32.

The above describes in detail an array substrate, a preparation method thereof, and a display panel provided in the embodiments of the present application. The principles and embodiments of the present application are described by using specific examples herein. The description of the foregoing embodiments is merely intended to help understand the methods and core ideas of the present application. At the same time, according to the ideas of this application, there will be changes in specific embodiments and application scope for those skilled in the art. In conclusion, the content of this specification shall not be construed as a limitation to this application.

The array substrate, preparation method thereof, and display panel provided by embodiments of the present application are described in detail above. In the present application, specific embodiments are applied to illustrate the principle and implementation of the present application, and the above embodiments are only used to help to understand the methods and core ideas of the present application. At the same time, for those skilled in the art, there may be some variations in the specific implementation and application scope according to the ideas of the present application. In summary, the contents of the present specification should not be construed as limitations of the present application.

What is claimed is:

1. An array substrate, comprising:
   a substrate comprising a pixel region and a non-pixel region which are adjacently disposed; and a touch unit disposed on the substrate, the touch unit is located in the non-pixel region, and the touch unit comprises:

a touch transistor disposed on the substrate, and the touch transistor comprises a first gate;

a pressure-sensitive layer disposed on the first gate; and a first touch electrode disposed on the pressure-sensitive layer;

wherein the array substrate further comprises a read transistor disposed in series with the touch transistor.

2. The array substrate of claim 1, wherein the first gate, the pressure-sensitive layer and the first touch electrode constitute a touch capacitor, and an orthographic projection of the touch capacitor on the substrate is located in an orthographic projection of the touch transistor on the substrate.

3. The array substrate of claim 1, wherein the orthographic projection of the touch transistor on the substrate is staggered from an orthographic projection of the read transistor on the substrate.

4. The array substrate of claim 3, wherein the touch transistor further comprises a first active portion, a first source, a first drain, a second gate, a buffer layer, and a first gate insulating portion, and the read transistor comprises a second source, a second gate insulating portion, and a third gate;

the first source, the second gate, the first drain, and the second source are disposed in the same layer on the substrate at intervals; the second gate is located between the first source and the first drain, and the first drain is located between the second gate and the second source;

the buffer layer covers the substrate, the first source, the second gate, the first drain, and the second source;

the first active portion is disposed on the buffer layer and connected to the first source, the first drain, and the second source;

the first gate insulating portion is disposed on the first active portion, and the first gate insulating portion is disposed above the second gate; the second gate insulating portion is disposed on the first active portion, and is disposed on the first active portion between the first drain and the second source, and the first gate insulating portion and the second gate insulating portion are disposed at intervals; and the first gate is disposed on the first gate insulating portion, and the third gate is disposed on the second gate insulating portion.

5. The array substrate of claim 3, wherein the touch transistor further comprises a first active portion, a second gate, a first source, a first drain, a passivation layer, a buffer layer, and a first gate insulating portion, and the read transistor comprises a second source, a second active portion, a second gate insulating portion, and a third gate;

the second gate is disposed on the substrate;

the buffer layer covers the substrate and the second gate;

the first active portion and the second active portion are disposed in a same layer on the buffer layer at intervals, and the first active portion is above the second gate;

the first gate insulating portion is disposed on the first active portion, and the second gate insulating portion is provided on the second active portion;

the first gate is disposed on the first gate insulating portion, and the third gate is disposed on the second gate insulating portion;

the passivation layer covers the buffer layer, the first active portion, the second active portion, the first gate insulating portion, the second gate insulating portion, the first gate, and the third gate; and the first source, the first drain, and the second source are disposed in a same layer on the passivation layer at intervals, the first source is connected to one side of the first active portion, the first drain is connected to another side of the first active portion and one side of the second active portion, and the second source is connected to the another side of the second active portion.

6. The array substrate of claim 1, wherein an orthographic projection of the touch transistor on the substrate overlaps an orthographic projection of the read transistor on the substrate.

7. The array substrate of claim 6, wherein the touch transistor further comprises a first active portion and a first drain connected to the first active portion, and the read transistor comprises a second active portion and a second drain connected to the second active portion and the first drain.

8. The array substrate of claim 7, wherein the touch transistor further comprises a planarization layer, a second gate, a first gate insulating portion, a first source, and an interlayer dielectric layer, and the read transistor further comprises a second gate insulating portion, a third gate, a passivation layer, and a second source;

the second active portion, the second gate insulating portion, and the third gate are stacked on the substrate in sequence;

the passivation layer covers the second active portion, the second gate insulating portion, the third gate, and the substrate;

the second source and the second drain are disposed in a same layer on the passivation layer, the second source and the second drain are disposed at intervals and connected to the second active portion;

the second gate is disposed on the passivation layer and above the third gate;

the planarization layer covers the passivation layer and the second gate;

the first active portion, the first gate insulating portion, and the first gate are stacked on the planarization layer in sequence and positioned above the second gate;

the interlayer dielectric layer covers the planarization layer, the first active portion, the first gate insulating portion, and the first gate; and the first source and the first drain are disposed in a same layer on the interlayer dielectric layer, the first source and the first drain are disposed at intervals, the first source is connected to one side of the first active portion, and the first drain is connected to the second drain and another side of the first active portion.

9. A display panel, wherein the display panel comprises an array substrate, and the array substrate comprises:

a substrate comprising a pixel region and a non-pixel region which are adjacently disposed; and a touch unit disposed on the substrate, the touch unit is located in the non-pixel region, and the touch unit comprises:

a touch transistor disposed on the substrate, and the touch transistor comprises a first gate;

a pressure-sensitive layer disposed on the first gate; and a first touch electrode disposed on the pressure-sensitive layer;

wherein the array substrate further comprises a read transistor disposed in series with the touch transistor.

10. The display panel of claim 9, wherein the first gate, the pressure-sensitive layer and the first touch electrode constitute a touch capacitor, and an orthographic projection of the touch capacitor on the substrate is located in an orthographic projection of the touch transistor on the substrate.

11. The display panel of claim 9, wherein the orthographic projection of the touch transistor on the substrate is staggered from an orthographic projection of the read transistor on the substrate.

12. The display panel of claim 11, wherein the touch transistor further comprises a first active portion, a first source, a first drain, a second gate, a buffer layer, and a first gate insulating portion, and the read transistor comprises a second source, a second gate insulating portion, and a third gate;

the first source, the second gate, the first drain, and the second source are disposed on the substrate in a same layer at intervals; the second gate is located between the first source and the first drain, and the first drain is located between the second gate and the second source;

the buffer layer covers the substrate, the first source, the second gate, the first drain, and the second source;

the first active portion is provided on the buffer layer and connected to the first source, the first drain, and the second source;

the first gate insulating portion is disposed on the first active portion, and the first gate insulating portion is disposed above the second gate; the second gate insulating portion is disposed on the first active portion, and is disposed on the first active portion between the first drain and the second source, and the first gate insulating portion and the second gate insulating portion are disposed at intervals; and the first gate is disposed on the first gate insulating portion, and the third gate is disposed on the second gate insulating portion.

13. The display panel of claim 11, wherein the touch transistor further comprises a first active portion, a second gate, a first source, a first drain, a passivation layer, a buffer layer, and a first gate insulating portion, and the read transistor comprises a second source, a second active portion, a second gate insulating portion, and a third gate;

the second gate is disposed on the substrate;

the buffer layer covers the substrate and the second gate;

the first active portion and the second active portion are disposed in a same layer on the buffer layer at intervals, and the first active portion is above the second gate;

the first gate insulating portion is disposed on the first active portion, and the second gate insulating portion is provided on the second active portion;

the first gate is disposed on the first gate insulating portion, and the third gate is disposed on the second gate insulating portion;

the passivation layer covers the buffer layer, the first active portion, the second active portion, the first gate insulating portion, the second gate insulating portion, the first gate and the third gate; and the first source, the first drain, and the second source are disposed in a same layer on the passivation layer at intervals, the first source is connected to one side of the first active portion, the first drain is connected to another side of the first active portion and one side of the second active portion, and the second source is connected to another side of the second active portion.

14. The display panel of claim 9, wherein an orthographic projection of the touch transistor on the substrate overlaps an orthographic projection of the read transistor on the substrate.

15. The display panel of claim 14, wherein the touch transistor further comprises a first active portion and a first drain connected to the first active portion, and the read transistor comprises a second active portion and a second drain connected to the second active portion and the first drain.

16. The display panel of claim 15, wherein the touch transistor further comprises a planarization layer, a second gate, a first gate insulating portion, a first source and an interlayer dielectric layer, and the read transistor further comprises a second gate insulating portion, a third gate, a passivation layer and a second source;

the second active portion, the second gate insulating portion, and the third gate are stacked on the substrate in sequence;

the passivation layer covers the second active portion, the second gate insulating portion, the third gate and the substrate;

the second source and the second drain are disposed in a same layer on the passivation layer, the second source and the second drain are disposed at intervals and connected to the second active portion;

the second gate is disposed on the passivation layer and above the third gate;

the planarization layer covers the passivation layer and the second gate;

the first active portion, the first gate insulating portion, and the first gate are stacked on the planarization layer in sequence and positioned above the second gate;

the interlayer dielectric layer covers the planarization layer, the first active portion, the first gate insulating portion and the first gate; and the first source and the first drain are disposed in a same layer on the interlayer dielectric layer, the first source and the first drain are disposed at intervals, the first source is connected to one side of the first active portion, and the first drain is connected to the second drain and another side of the first active portion.

17. A method for preparing an array substrate, comprising steps of:

providing a substrate comprising a pixel region and a non-pixel region which are adjacently disposed;

forming a touch transistor on the substrate, the touch transistor comprises a first gate, and the touch transistor is located in the non-pixel region;

providing a pressure-sensitive layer material on the touch transistor, and patterning the pressure-sensitive layer material to form a pressure-sensitive layer on the first gate;

providing a first touch electrode material on the touch transistor and the pressure-sensitive layer, and patterning the first touch electrode material to form a first touch electrode on the pressure-sensitive layer; and providing a read transistor disposed in series with the touch transistor.

18. The method of claim 17, wherein the step of forming a touch transistor on the substrate comprises:

providing a conductive material on the substrate, and patterning the conductive material to form a first source, a second gate, a first drain, and a second source disposed at intervals;

forming a buffer layer on the substrate, the first source, the second gate, the first drain, and the second source;

providing an active layer material on the buffer layer, and patterning the active layer to form a first active portion connected to the first source, the first drain, and the second source; and stacking a gate insulating layer material and a gate material in sequence on the buffer layer and the first active portion, patterning the gate insulating layer material and the gate material to form a first gate insulating portion, a second gate insulating portion, a first gate, and a third gate, the first gate insulating portion and the second gate insulating portion are disposed at intervals, the first gate insulating portion is located above the second gate, the second gate insulating portion is located between the first drain and the second source, the first gate is located on the first gate insulating portion, and the third gate is located on the second gate insulating portion.

* * * * *